(12) United States Patent
Johnson et al.

(10) Patent No.: US 7,149,141 B2
(45) Date of Patent: Dec. 12, 2006

(54) MEMORY DEVICE AND METHOD HAVING LOW-POWER, HIGH WRITE LATENCY MODE AND HIGH-POWER, LOW WRITE LATENCY MODE AND/OR INDEPENDENTLY SELECTABLE WRITE LATENCY

(75) Inventors: Christopher S. Johnson, Meridian, ID (US); Brian Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 255 days.

(21) Appl. No.: 11/035,905

(22) Filed: Jan. 14, 2005

(65) Prior Publication Data
US 2005/0122797 A1    Jun. 9, 2005

Related U.S. Application Data

(62) Division of application No. 10/317,429, filed on Dec. 11, 2002, now Pat. No. 6,934,199.

(51) Int. Cl.
*G11C 7/00* (2006.01)

(52) U.S. Cl. .................................. 365/226; 365/230.06

(58) Field of Classification Search ........... 365/189.05, 365/189.06, 189.08, 226, 229, 227, 230.06, 365/230.08
See application file for complete search history.

(56) References Cited

U.S. PATENT DOCUMENTS

| | | | |
|---|---|---|---|
| 5,953,278 A | 9/1999 | McAdams et al. | 365/219 |
| 6,310,825 B1 | 10/2001 | Furuyama | 365/233 |
| 6,324,119 B1 | 11/2001 | Kim | 365/233 |
| 6,349,068 B1 * | 2/2002 | Takemae et al. | 365/222 |
| 6,438,066 B1 | 8/2002 | Ooishi et al. | 365/233 |
| 6,442,644 B1 | 8/2002 | Gustavson et al. | 711/105 |
| 6,484,246 B1 | 11/2002 | Tsuchida et al. | 711/169 |
| 6,609,236 B1 | 8/2003 | Watanabe et al. | 716/8 |
| 6,614,698 B1 | 9/2003 | Ryan et al. | 365/189.04 |
| 6,618,319 B1 | 9/2003 | Ooishi et al. | 365/233 |
| 6,665,231 B1 | 12/2003 | Mizuno et al. | 365/233 |
| 6,775,190 B1 | 8/2004 | Setogawa | 365/193 |
| 6,788,616 B1 | 9/2004 | Takahashi | 365/233 |
| 6,789,209 B1 | 9/2004 | Suzuki et al. | 713/401 |
| 6,807,108 B1 | 10/2004 | Maruyama et al. | 365/189.05 |
| 6,810,449 B1 | 10/2004 | Barth et al. | 710/61 |
| 6,819,624 B1 * | 11/2004 | Acharya et al. | 365/233 |

* cited by examiner

*Primary Examiner*—Richard Elms
*Assistant Examiner*—Hien Nguyen
(74) *Attorney, Agent, or Firm*—Dorsey & Whitney, LLP

(57) ABSTRACT

A logic circuit operates write receivers in a dynamic random access memory device in either a low-power mode, high write latency mode or a high-power mode, low write latency mode. The logic circuit receives a first signal indicative of whether the high-power, low write latency mode has been enabled, a second signal indicative of whether a row of memory cells in the memory device is active, a third signal indicative of whether the memory device is being operated in a power down mode, and a fourth signal indicative of whether read transmitters in the memory device are active. The logic circuit maintains power to the write receivers whenever the high-power, low write latency mode has been enabled if a row of memory cells in the memory device is active, the memory device is not being operated in the power down mode, and the read transmitters in the memory device are not active.

13 Claims, 3 Drawing Sheets

MEMORY DEVICE AND METHOD HAVING LOW-POWER, HIGH WRITE LATENCY MODE AND HIGH-POWER, LOW WRITE LATENCY MODE AND/OR INDEPENDENTLY SELECTABLE WRITE LATENCY

CROSS-REFERENCE TO RELATED APPLICATION

This application is a divisional of U.S. patent application Ser. No. 10/317,429, filed Dec. 11, 2002 Now U.S. Pat. No. 6,934,199.

TECHNICAL FIELD

This invention relates to dynamic random access memories ("DRAMs"), and, more particularly, to a circuit and method for operating DRAMs in either a low-power, high write latency mode or a high-power, low write latency mode.

BACKGROUND OF THE INVENTION

The power consumed by integrated circuits can be a critical factor in their utility in certain applications. For example, the power consumed by memory devices used in portable personal computers greatly affects the length of time they can be used without the need to recharge batteries powering such computers. Power consumption can also be important even where memory devices are not powered by batteries because it may be necessary to limit the heat generated by the memory devices.

In general, memory device power consumption increases with both the capacity and the operating speed of the memory devices. As the capacity of memory devices increase, for example, the memory devices contain more memory cells that must be periodically refreshed, and the number of address bits that must be received and processed increases. As the speed of memory devices increases, the large number of signal lines in the memory devices change state more rapidly, consuming power with each state change. Various approaches have been used to reduce the power consumption of memory devices. For example, techniques have been developed to reduce the required refresh rate of memory devices, to reduce the magnitude of the voltage needed to operate all or portions of memory devices, and to reduce the power consumed by memory devices when another memory device is being accessed. For example, power consumption has been reduced during certain DRAM refresh modes by removing power to input buffers when the DRAM is operating in such modes.

As is well known in the art, memory devices are generally coupled to controlling devices, such as memory controllers or system controllers, in a bus architecture. In a bus architecture, several memory devices are connected in parallel to each other and to the controlling device. As a result, when the controlling device is applying addresses or data to one memory device, all of the other memory devices also receive the addresses or data. The addresses and data are conventionally coupled to the data and addresses buses through receivers or input buffers, which may simply be inverters. Each time a data bit or address bit coupled to one of these receivers changes state, the receivers switch, thereby consuming power. Yet only one of the memory devices will use these data or addresses. The power consumed by switching the receivers in all of the other memory device thus constitutes wasted power.

One technique that has been used to reduce the power consumed by inactive memory devices is to remove power from data buffers in the inactive memory devices. Using this approach, each memory device decodes commands to determine when a command is being issued to access a memory device. Each memory device also decodes addresses to detect when a memory access is directed at that particular memory device. Control circuits in the memory device remove power to all of the data input buffers (also known as write receivers) until a write access is detected that is directed to that particular memory device. Similarly, the control circuits remove power to all of the data output buffers (also known as read transmitters) until a read access is detected that is directed to that particular memory device. By removing power to the write receivers and read transmitters unless a write access or read access, respectively, is directed to the memory device, a significant reduction in the power consumed by the memory device may be achieved.

Although power can be removed from the data receivers and transmitters when a memory device is inactive, power cannot similarly be removed from command and address receivers because they must be active to detect when a read or a write access is directed to that memory device. If power were removed from the command and address buffers, they would be unable to couple the command and address signals to internal circuitry that detects a read or a write access directed to that memory device.

Although selectively removing power to write receivers and read transmitters provides the benefit of reduced power consumption, this benefit comes at the price of reduced data access speed. More specifically, power does not begin to be applied to the write receivers in a conventional memory device until the memory device has decoded a write command and an address directed to that memory device. Until power has been fully applied to the write receivers, the write receivers cannot couple write data to circuitry in the memory device. In conventional memory devices it typically can require 6–8 ns to fully power-up the write receivers in the memory devices. When operating with a 300 MHz clock signal, for example, it will require 2 clock cycles before the write receivers can couple write data to internal circuitry. As a result, the minimum write latency of such memory device is 2 clock cycles. Yet it is often desirable for the write latency to be less that 2 clock cycles. The write latency of a memory device is normally set using a variety of techniques. For some memory devices, there is either no write latency, or the write latency is fixed at a predetermined number of clock cycles, such as 1 clock cycle. With other memory devices, the write latency is set by the user programming a mode register. In still other memory devices, the write latency is set by selecting the read latency of the memory device. The write latency may be, for example, 1 or 2 clock cycles less than the read latency. In this example, a minimum write latency of 2 clock cycles would limit the read latency to 3 or 4 clock cycles. Latencies of this magnitude can greatly slow the operating speed of conventional memory devices.

Although selectively removing power to write receivers in a memory device adversely affects the write latency of the memory device, selectively removing power to read transmitters in the memory device does not adversely affect the read latency of the memory device. The primary reason for this difference is that read data cannot be coupled from the memory device until well after a read command and a read address have been coupled to the memory device since the read data must first be accessed from an array of memory cells and then coupled to data bus terminals of the memory device. In contrast, write data can be coupled to the data bus terminals of the memory device along with or shortly after a write command and a write address have been coupled to the memory device since the write data is subsequently coupled to the array of memory cells. Thus, the problem of increased latencies caused by selectively removing power to receivers or transmitters exists only for removing power to write receivers.

There is therefore a need for a circuit and method that allows a memory device to operate in a low-power mode yet not adversely affect write latency in situations where achieving a minimum write latency is more critical than achieving reduced power.

SUMMARY OF THE INVENTION

A method and circuit for a memory device allows the memory device to operate in either a low-power mode that may increase the write latency of the memory device or a high-power mode that minimizes the write latency of the memory device. In the low-power mode, the memory device operates in the conventional fashion described above to remove power to the write receivers in the memory device except when the memory device detects a write access to that memory device. In the high-power mode, power is not removed from the write receivers under most circumstances so the write receivers can immediately couple write data to internal circuitry, thereby avoiding increased write latencies that may occur when operating in the low-power mode. However, even in the high-power mode, power is preferably removed from the write receivers when none of the rows of memory cells in the memory device is active. Power is also preferably removed from the write receivers even in the high-power mode when the read transmitters in the memory device are active. The method and circuit for allowing memory devices to operate in either a low-power mode or a high-power mode is preferably used in dynamic random access memory ("DRAM") devices, and such DRAM devices may be used in a computer system or some other electronic system.

DETAILED DESCRIPTION OF THE INVENTION

Figure 1:
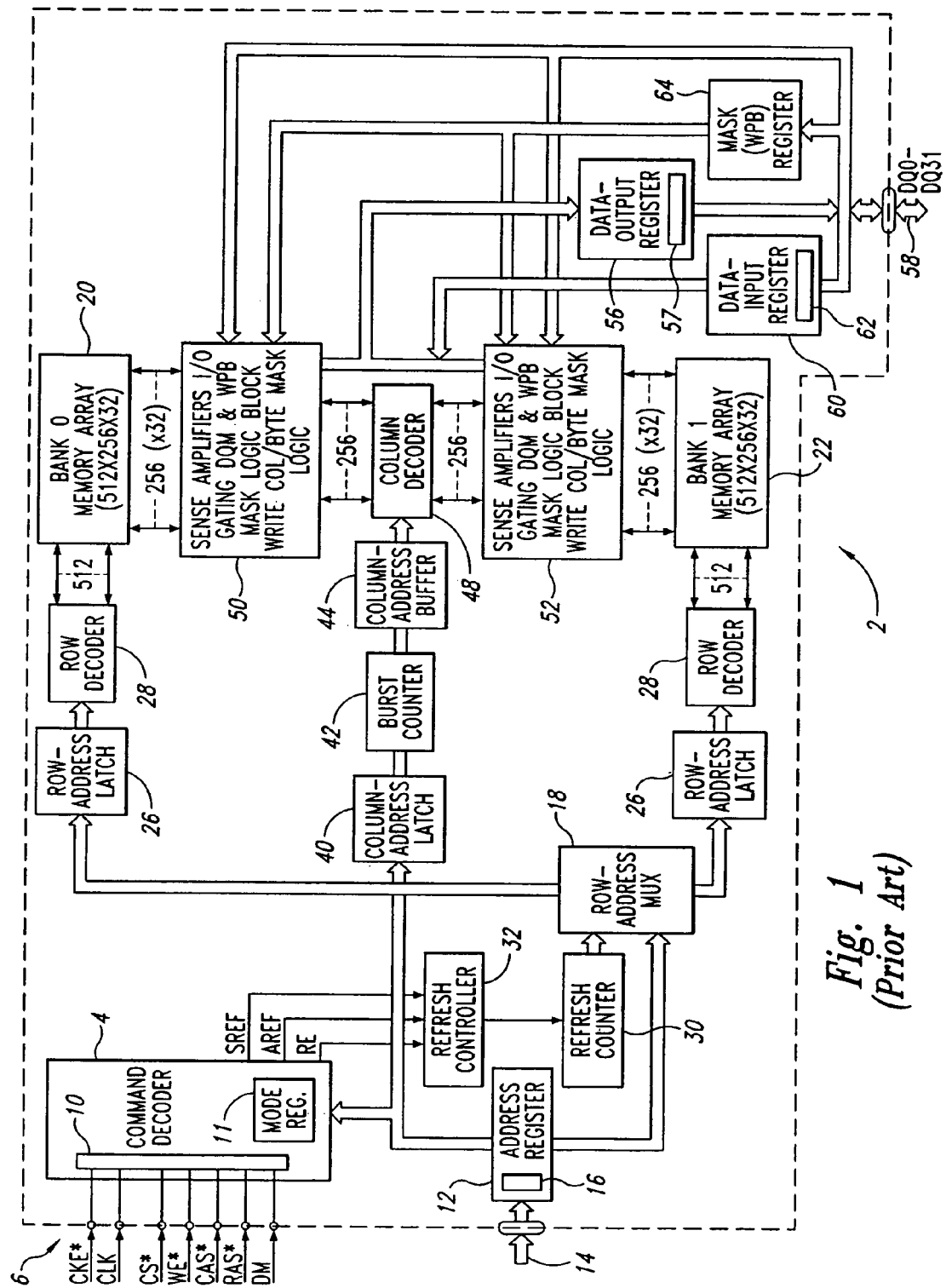
FIG. 1 is a block diagram of a conventional memory device that can be modified to operate in either a low-power mode or a high-power mode according to an embodiment of the invention.

FIG. 1 is a block diagram of a conventional synchronous dynamic random access memory ("SDRAM") 2 that can utilize a dual-power system according to one embodiment of the invention. However, it will be understood that various embodiments of the present invention can also be used in other types of DRAMs or other types of memory devices.

The operation of the SDRAM 2 is controlled by a command decoder 4 responsive to high-level command signals received on a control bus 6. These high level command signals, which are typically generated by a memory controller (not shown in FIG. 1), are a clock enable signal CKE*, a clock signal CLK, a chip select signal CS*, a write enable signal WE*, a row address strobe signal RAS*, a column address strobe signal CAS*, and a data mask signal DM, in which the "*" designates the signal as active low. The command decoder 4 includes a plurality of input buffers or command receivers, collectively designated by reference numeral 10, through which the high-level command signals are coupled. As previously explained, the command receivers 10 are normally powered at virtually all times so memory commands directed to the memory device 2 can be detected. The command decoder 4 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these command signals will be omitted. The command decoder 4 may also include a mode register 11 that can be programmed to control the operating mode of the SDRAM 2, such as its read latency.

The SDRAM 2 includes an address register 12 that receives row addresses and column addresses through an address bus 14. The address bus 14 is generally coupled to a memory controller (not shown in FIG. 1). The address register 12 includes a plurality of input buffers or address receivers, collectively designated by reference numeral 16. Each of the address receivers 16 couples a respective address bit to circuitry in the address register 12. As also previously explained, the address receivers 16 are normally powered at virtually all times so the SDRAM 2 can determine that a particular memory commands is directed to it. A row address is generally first received by the address register 12 and applied to a row address multiplexer 18. The row address multiplexer 18 couples the row address to a number of components associated with either of two memory banks 20, 22 depending upon the state of a bank address bit forming part of the row address. Associated with each of the memory banks 20, 22 is a respective row address latch 26, which stores the row address, and a row decoder 28, which decodes the row address and applies corresponding signals to one of the arrays 20 or 22. The row address multiplexer 18 also couples row addresses to the row address latches 26 for the purpose of refreshing the memory cells in the arrays 20, 22. The row addresses are generated for refresh purposes by a refresh counter 30, which is controlled by a refresh controller 32. The refresh controller 32 is, in turn, controlled by the command decoder 4.

After the row address has been applied to the address register 12 and stored in one of the row address latches 26, a column address is applied to the address register 12. The address register 12 couples the column address to a column address latch 40. Depending on the operating mode of the SDRAM 2, the column address is either coupled through a burst counter 42 to a column address buffer 44, or to the burst counter 42 which applies a sequence of column addresses to the column address buffer 44 starting at the column address output by the address register 12. In either case, the column address buffer 44 applies a column address to a column decoder 48, which applies various column signals to corresponding sense amplifiers and associated column circuitry 50, 52 for one of the respective arrays 20, 22.

Data to be read from one of the arrays 20, 22 is coupled to the column circuitry 50, 52 for one of the arrays 20, 22, respectively. The data is then coupled to a data output register 56, which includes a plurality of read transmitters, collectively indicated by reference numeral 57. Each of the read transmitters 57 applies a respective data bit to respective conductor of a data bus 58. Power is normally applied to the read transmitters 57 only when the read transmitters 57 are called upon to couple read data to the data bus 58 responsive to detecting a read memory access to that SDRAM 2. Data to be written to one of the arrays 20, 22 are coupled from the data bus 58 through a data input register 60. The data input register 60 includes a plurality of write receivers 62 that couple a respective bit of write data from the data bus 48 to internal circuitry in the data input register 60. The write data are then coupled to the column circuitry 50, 52 where they are transferred to one of the arrays 20, 22, respectively. A mask register 64 responds to a data mask DM signal to selectively alter the flow of data into and out of the column circuitry 50, 52, such as by selectively masking data to be read from the arrays 20, 22. As explained above, in conventional SDRAMs 2, power is normally applied to the write receivers 62 only when a write memory access to that SDRAM 2 is detected.

Figure 2:
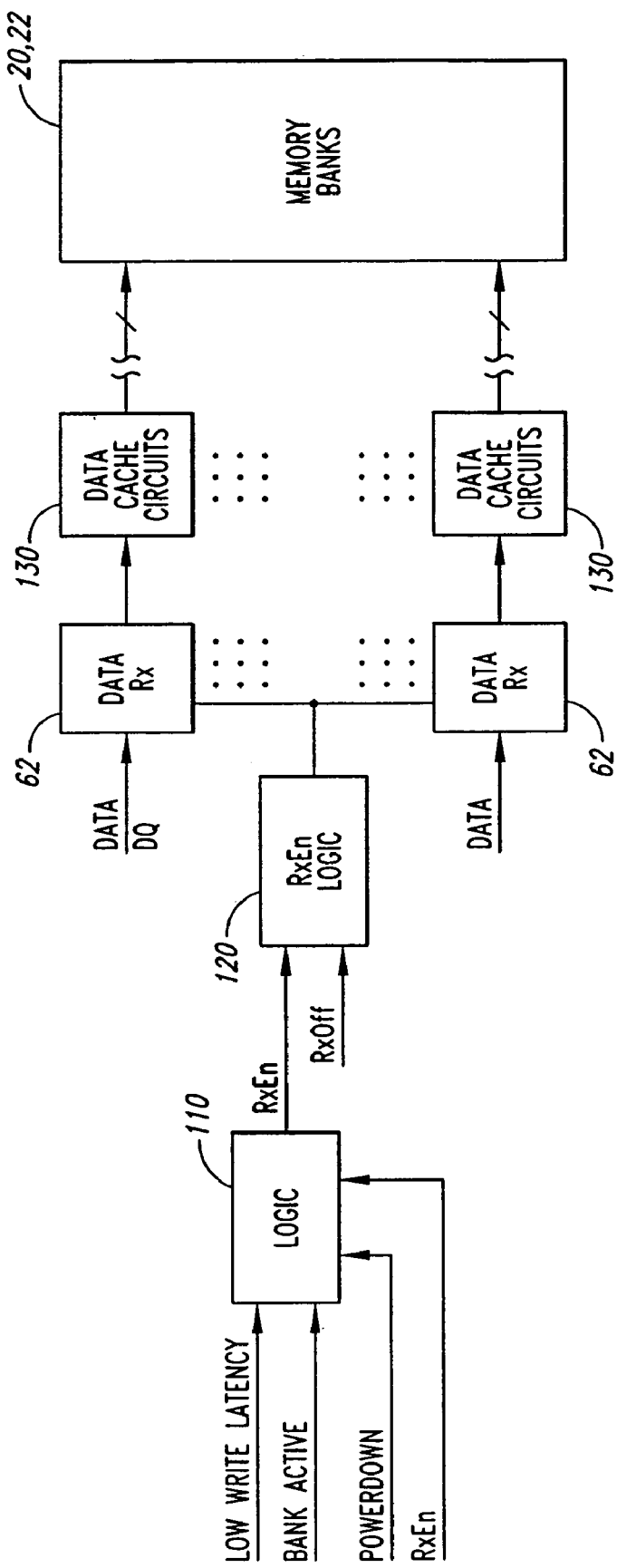
FIG. 2 is a block diagram of one embodiment of a system according to the present invention that allows the memory device of FIG. 1 to operate in either a low-power mode or a high-power mode.

One embodiment of a system 100 for allowing the SDRAM 2 of FIG. 1 or another memory device to operate in either a low-power, high write latency mode or a high-power, low write latency mode is shown in FIG. 2.

The system 100 shown in FIG. 2 includes a logic circuit 110 that receivers a number of input signals to generate a receiver enable signal "$R_XE_N$" when power is to be applied to the write receivers 62 (FIG. 1). The logic circuit 110 essentially functions to decode certain combinations of these input signals. For this reason, the logic circuit 110 is preferably a part of the command decoder 4, although it may also be part of another component of the SDRAM 2 or a separate component of the SDRAM 2 or some other memory device.

The input signals applied to the logic circuit 110 include a "Low Write Latency" signal that is active to allow the system 100 to operate in the high-power, low write latency mode described above. The Low Write Latency signal is preferably provided by the mode register 11 in the command decoder 4 (FIG. 1), which is programmed to select this mode in a conventional manner. However, the Low Write Latency signal alternatively may be provided by other components in the SDRAM 2. For example, it may be provided by a logic circuit (not shown) that selects the high-power, low write latency mode if doing so would allow the memory device to achieve a write latency that is either selected by the user or, for example, a latency value based on the read latency. By way of further example, the Low Write Latency signal may be a signal applied to an externally accessible terminal of the SDRAM 2 so that either the high-power, low write latency mode or the low power, high write latency mode can be directly selected by devices external to the SDRAM 2. For example, the mode could be chosen by a microprocessor based on the nature of the software that it is executing.

Another input signal decoded by the logic circuit 110 is a "Bank Active" signal that indicates a row in either BANK 0 20 (FIG. 1) or BANK 1 22 has been activated. As is well known in the art, a row of memory cells must be activated before data can be read from or written to either of the banks 20, 22 of memory cells. If there is no active row in the SDRAM 2, then the need to apply power to the write receivers 62 will not limit the write access time because it requires far more time to activate a row of the SDRAM 2 than it does to power-up the write receivers 62. The Bank Active signal is normally present in the SDRAM 2 for other purposes. However, if it is not already present in the SDRAM 2, it can be provided by conventional means.

Another input signal applied to the logic circuit 110 is a "Power Down" signal that is also normally present in the SDRAM 2. The Power Down signal is active to indicate that power should be removed from much of the circuitry in the SDRAM 2 when the SDRAM 2 is to be inactive for a considerable period. For example, in computer systems having a "sleep" mode in which the computer system is inactive, the SDRAM 2 is normally inactive except for periodically refreshing memory cells in the memory banks 20, 22. The Power Down signal is normally provided by a clock enable circuit (not shown) in the command decoder 4, although it may alternatively be provided by other circuitry in the SDRAM 2 or elsewhere in a conventional manner or by some other means.

The final input signal to the logic circuit is a Receiver Enable "$R_XE_N\hat{\,}$" signal that is normally provided by the command decoder 4 to remove power from the write receivers 62 in a conventional manner. As previously explained, the $R_XE_N\hat{\,}$ signal is normally active whenever the command decoder 4 detects a command corresponding to a write memory access, and the row decoders 28 detect an access to the SDRAM 2.

The operation of the logic circuit 110 will be apparent from the following Truth Table, in which "1" signifies an active state, "0" signifies an inactive state, and X signifies a "don't care" state in which a signal is not used when other signals have the states shown:

| Low Write Latency | Bank Active | Power Down | $R_XE_N\hat{\,}$ Input | $R_XE_N$ Output |
|---|---|---|---|---|
| 0 | 0 | 0 | 0 | 0 |
| 0 | 1 | 0 | 1 | 1 |
| 1 | 0 | 0 | 0 | 0 |
| 1 | 1 | 0 | X | 1 |
| X | X | 1 | X | 0 |

The Truth Table can be used by one skilled in the art to easily design the logic circuit 110 to accomplish the functions indicated by the Table.

It can be seen from the above Truth Table that, in the high-power, low write latency mode, the $R_XE_N$ signal is active to apply power to the write receivers 62 whenever a bank 20, 22 in the SDRAM 2 is active and the SDRAM 2 has not been switched to its Power Down mode, regardless of whether the command decoder 4 is attempting to remove or apply power to the write receivers 62. In the low-power, high write latency mode, the $R_XE_N\hat{\,}$ signal from the command decoder 4 makes the $R_XE_N$ signal active to apply power to the write receivers 62 as along as a bank 20, 22 in the SDRAM 2 is active and the SDRAM 2 has not been switched to its Power Down mode. However, in either mode, if a bank 20, 22 in the SDRAM 2 is not active or the SDRAM 2 has been switched to its Power Down mode, power is never applied to the write receivers 62.

With further reference to FIG. 2, the system 100 also includes a Receiver Enable Logic circuit 120 that receives the $R_XE_N$ signal from the logic circuit 110 and a "Receiver Off" $R_X$Off signal. The $R_X$Off signal is active whenever power is applied to the read transmitters 57 (FIG. 1) to allow the read transmitters 57 to apply read data to the data bus 58. The $R_X$Off signal is preferably provided by conventional circuitry in the SDRAM 2 that is used to apply power to the read transmitters 57. For this reason, the Receiver Enable Logic circuit 120 is preferably located near the write receivers 62 and the read transmitters 57, which are typically fabricated in close proximity to data bus terminals of the SDRAM 2. This close proximity of the Receiver Enable Logic circuit 120 to the write receivers 62 and the read transmitters 57 is the reason the Receiver Enable Logic circuit 120 is shown in FIG. 2 as not being part of the logic circuit 110. However, it will be understood that the Receiver Enable Logic circuit 120 and the logic circuit 110 may be combined into a single logic circuit, and either the Receiver Enable Logic circuit 120 or the logic circuit 110 may be divided into two or more separate logic circuts.

In operation, the Receiver Enable Logic circuit 120 outputs an active Power signal "PWR" whenever the $R_XE_N$ signal is active unless the $R_X$Off signal is active. Thus, the $R_X$Off signal overrides the PWR signal. As soon as power is removed from the read transmitters 57, the $R_X$Off signal transitions to an inactive state to allow the Receiver Enable Logic circuit 120 to output an active PWR signal.

As further shown in FIG. 2, the PWR signal from the Receiver Enable Logic circuit 120 is coupled to power enable inputs of the write receivers 62, two of which are shown in FIG. 2. The write receivers 62 receiver respective write data bits from the data bus 58, and apply the write data bits to respective data cache circuits 130, which may be of conventional design. The write data may be stored in the data cache circuits 130 and subsequently coupled through suitable data path circuitry (not shown) to the banks 20, 22 of memory cells. The write data may, of course, alternatively be coupled from the write receivers 62 to the memory banks 20, 22 by other means.

As mentioned above, the latency mode can be selected by programming the mode register 11 (FIG. 1) in a suitable manner. However, other techniques can be used to select between the high-power, low write latency mode or the low-power, high write latency mode. For example, the logic circuit 110 could be designed to select either the low-power, high write latency mode or the high-power, low write latency mode as a function of a signal applied to the SDRAM 2 through an externally accessible terminal. The external signal could be supplied by a processor (not shown in FIG. 2) or other circuit depending on the nature of the software being executed. If the processor was executing a memory intensive application, such as a graphics program, it could select the high-power, low write latency mode. If the processor was executing an application that was not memory intensive, such as a computationally intensive program like a spreadsheet, the processor could select the low-power, high write latency mode.

The write latency may, of course, be determined in a conventional manner by selecting the write latency as a function of the read latency. If a read latency of 3 clock cycles was selected, for example, the write latency would automatically be set by suitable means to 2 clock cycles (if the write latency was one clock cycle less than the read latency) or to 1 clock cycle (if the write latency was two clock cycles less than the read latency). If the write latency was two clock cycles less than the read latency, the logic circuit 110 could be designed to automatically select the high-power, low write latency mode to allow the SDRAM 2 to operate with a write latency of 1 clock cycle. If the write latency was one clock cycles less than the read latency, the logic circuit 110 would select the low-power, high write latency mode since no advantage would be obtained by using the high-power mode if the SDRAM 2 operated with a write latency of 2 clock cycles. Other techniques may also be used to select the write latency and/or whether the high-power, low write latency is used.

Figure 3:
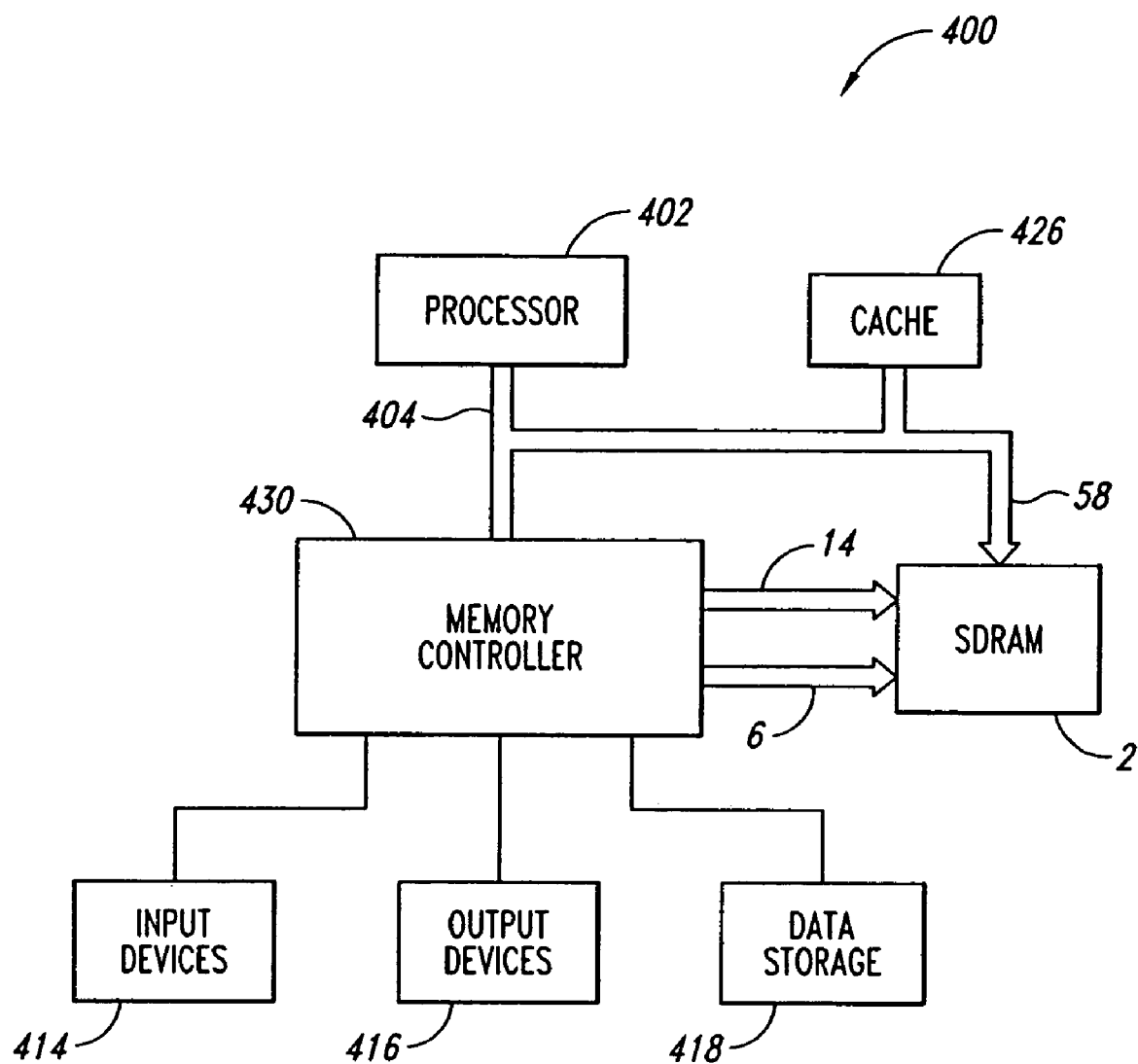
FIG. 3 is a block diagram of a computer system using the memory device of FIG. 1 containing the dual-mode system of FIG. 2.

FIG. 3 shows an embodiment of a computer system 400 that may use the SDRAM 2 or some other memory device that contains the system 100 for allowing operation in either a low-power mode or a high-power mode or some other embodiment of a system in accordance with the invention. The computer system 400 includes a processor 402 for performing various computing functions, such as executing specific software to perform specific calculations or tasks. The processor 402 includes a processor bus 404 that normally includes an address bus, a control bus, and a data bus. In addition, the computer system 400 includes one or more input devices 414, such as a keyboard or a mouse, coupled to the processor 402 to allow an operator to interface with the computer system 400. Typically, the computer system 400 also includes one or more output devices 416 coupled to the processor 402, such output devices typically being a printer or a video terminal. One or more data storage devices 418 are also typically coupled to the processor 402 to store data or retrieve data from external storage media (not shown). Examples of typical storage devices 418 include hard and floppy disks, tape cassettes, and compact disk read-only memories (CD-ROMs). The processor 402 is also typically coupled to a cache memory 426, which is usually static random access memory ("SRAM") and to the SDRAM 2 through a memory controller 430. The memory controller 430 includes an address bus coupled to the address bus 14 (FIG. 1) to couple row addresses and column addresses to the DRAM 2. The memory controller 430 also includes a control bus that couples command signals to a control bus 6 of the SDRAM 2. The external data bus 58 of the SDRAM 2 is coupled to the data bus of the processor 402, either directly or through the memory controller 430.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. In a memory device having a plurality of write receivers for receiving respective data bits from a data bus and a plurality of read transmitters for applying respective data bits to a data bus, a method of operating the write receivers in either a high-power, low write latency mode or a low-power, high write latency mode, comprising:

applying power to the write receivers when the read transmitters are not active regardless of whether the write receivers are active when the write receivers are being operated in the high-power, low write latency mode;

removing power from the write receivers when the read transmitters are active when the write receivers are being operated in the high-power, low write latency mode;

applying power to the write receivers when the write receivers are active and the read receivers are not active when the write receivers are being operated in the low-power, high write latency mode; and removing power to the write receivers when either the write receivers are not active or the read transmitters are active when the write receivers are being operated in the low-power, high write latency mode.

2. The method of claim 1, further comprising:

determining whether a row of memory cells in the memory device is active;

if a determination is made that a row of memory cells in the memory device is active, allowing power to be applied to the write receivers; and if a determination is made that a row of memory cells in the memory device is not active, inhibiting power from being applied to the write receivers.

3. The method of claim 1, further comprising:

determining whether a the memory device is operating in a power down mode;

if a determination is made that memory device is not operating in a power down mode, allowing power to be applied to the write receivers; and if a determination is made that memory device is operating in a power down mode, inhibiting power from being applied to the write receivers.

4. The method of claim 1, further comprising selecting either the high-power, low write latency mode or the low-power, high write latency mode by programming a mode register in the memory device.

5. The method of claim 1, further comprising selecting either the high-power, low write latency mode or the low-power, high write latency mode by applying a signal to an externally accessible terminal of the memory device.

6. The method of claim 1, further comprising selecting either the high-power, low write latency mode or the low-power, high write latency mode by:

determining a write latency;

selecting the low-power, high write latency mode if the determined write latency is greater than a write latency that requires the write receivers to be operated in the high-power, low write latency mode; and selecting the high-power, low write latency mode if the determined write latency is less than or equal to a write latency that requires the write receivers to be operated in the high-power, low write latency mode.

7. The method of claim 6 wherein the act of determining the write latency comprises determining the write latency as a function of the read latency of the memory device.

8. The method of claim 1 wherein the memory device comprises a dynamic random access memory device.

9. In a memory device having a plurality of write receivers for receiving respective data bits from a data bus and a plurality of read transmitters for applying respective data bits to a data bus, a method of operating the write receivers, comprising:

determining the write latency of the memory device independently of the read latency of the memory device; and applying power to the write receivers as a function of the determined write latency.

10. The method of claim 9 wherein the act of applying power to the write receivers as a function of the determined write latency comprises:

applying power to the write receivers when the write receivers are active and the read receivers are not active if the determined write latency is greater than to a predetermined write latency;

removing power to the write receivers when either the write receivers are not active or the read transmitters are active if the determined write latency is greater than to a predetermined write latency;

applying power to the write receivers when the read transmitters are not active regardless of whether the write receivers are active if the determined write latency is less than or equal to a predetermined write latency; and removing power from the write receivers when the read transmitters are active if the determined write latency is less than or equal to a predetermined write latency.

11. The method of claim 9 wherein the act of determining the write latency of the memory device independently of the read latency of the memory device comprises programming a mode register in the memory device to select the write latency.

12. The method of claim 9 wherein the act of determining the write latency of the memory device independently of the read latency of the memory device comprises applying a signal through an externally accessible terminal of the memory device.

13. The method of claim 9 wherein the memory device comprises a dynamic random access memory device.

* * * * *